United States Patent [19]
Kim

[11] Patent Number: 5,936,309
[45] Date of Patent: Aug. 10, 1999

[54] MOUNTED STRUCTURE OF PRINTED CIRCUIT BOARD IN SEMICONDUCTOR PACKAGE

[75] Inventor: Woo-Young Kim, Suwon, Rep. of Korea

[73] Assignee: Samsung Electronics Co., Ltd., Suwon, Rep. of Korea

[21] Appl. No.: 09/045,642

[22] Filed: Mar. 23, 1998

[30] Foreign Application Priority Data

Oct. 23, 1997 [KR] Rep. of Korea .................. 97-54495

[51] Int. Cl.⁶ .................. H05K 1/18; H05K 1/14
[52] U.S. Cl. .................. 257/779; 257/780; 257/781; 257/783; 257/786; 257/714; 361/767; 361/768; 361/771; 174/261
[58] Field of Search .................. 361/767, 768, 361/771; 257/779, 781, 780, 783, 786, 714

[56] References Cited

U.S. PATENT DOCUMENTS 5,493,075  2/1996  Chong et al. .................. 174/261

Primary Examiner—Peter Toby Brown
Assistant Examiner—Hung Van Duong
Attorney, Agent, or Firm—Burns, Doane, Swecker & Mathis, L.L.P.

[57] ABSTRACT

A mounted structure of printed circuit board in semiconductor package, the mounted structure comprising a solder resist formed with at least more than one tunnel connecting outsides with respective pads of printed circuit board mounted with substrate, whereby the solder resist is improved in construction thereof to allow the flux gas to be easily extracted for prevention of generation of void.

3 Claims, 3 Drawing Sheets

MOUNTED STRUCTURE OF PRINTED CIRCUIT BOARD IN SEMICONDUCTOR PACKAGE

BACKGROUND OF THE INVENTION

1. Field of the Invention

The present invention relates to a mounted structure of printed circuit board in a semiconductor package and more particularly to a mounted structure of printed circuit board (PCB) in a semiconductor package adapted to allow flux gas to be easily discharged outside to thereby prevent generation of void.

2. Description of the Prior Art

Generally, semiconductor manufacturers are accelerating development of new types of packages and trying to apply same to the manufacture of semiconductors according to the current trend of miniaturization and high functionalism of electronic parts.

By way of example, an existing representative type of package, Quad Flat Package (QFT) is being rapidly replaced by new types of packages such as Ball Grid Array (BGA), flip chip, Chip Size Package (CSP) and the like. However, the new types of packages have raised problems in that the packages cannot be soldered onto PCB unless a new technique of printing a cream solder is supported, specifically, in case of CSP.

Furthermore, a technical field for designing a solder resist is also important in addition to the cream solder thus mentioned. There is a problem in the conventional design of solder resist in that a large quantity of voids are generated at a soldering part to thereby decrease reliability of PCB mounted with a package.

FIGS. 1 and 2 are schematic diagrams for illustrating a mounted state of a Chip Size Package, 1 of Land Grid Array type to a PCB 2, where, the PCB 2 formed with a solder resist 3 is printed with a cream solder 4, and then, a substrate 5 mounted with the CSP 1 formed with the solder resist 3 is positioned on the PCB 2 to perform a reflow soldering and to mount the CSP 1 to the PCB 2.

At this time, in case a copper pad 6 formed underneath the substrate 5 of the CSP 1 is thicker than the solder resist 3, the solder resist 3 of PCB 2 contacts the solder resist 3 formed underneath the substrate of the CSP 1 to create a hermetic void such that flux gas cannot be extracted, thereby, generating a void therein.

When the flux gas is kept inside, the soldering part, the flux gas in captivity in the void absorbs heat and in the processes of contraction and expansion, cracks are generated in the soldering part, leading to a functional paralysis of the PCB 2.

In order to overcome the generation of the void, holes are conventionally drilled to the PCB to leak out the flux gas, however, there is a problem in the conventional method thus described in that it is next impossible to drill a PCB due to the current trend of miniaturization of electronic parts.

SUMMARY OF THE INVENTION

Accordingly, the present invention is presented to solve the aforementioned problems and it is an object of the present invention to provide a mounted structure of printed circuit board in a semiconductor package by which flux gas can be easily discharged when the semiconductor package is reflow-soldered to mount same a printed circuit board to thereby prevent a creation of a void.

In accordance with the object of the present invention, there is provided a mounted structure of printed circuit board in a semiconductor package, the mounted structure comprises a substrate mounted with the semiconductor package; a printed circuit board mounted with the substrate; respective pads formed on each side of the substrate and the printed circuit board; and solder resists formed on each side of the substrate and printed circuit board, wherein the solder resists are so arranged on the substrate and the printed circuit boards as to allow at least more than one tunnel to be formed between the resists and the pads, so that the tunnel communicates with outsides thereof.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE INVENTION

The preferred embodiment of the present invention will now be described in detail with reference to the accompanying drawings.

Figure 1:
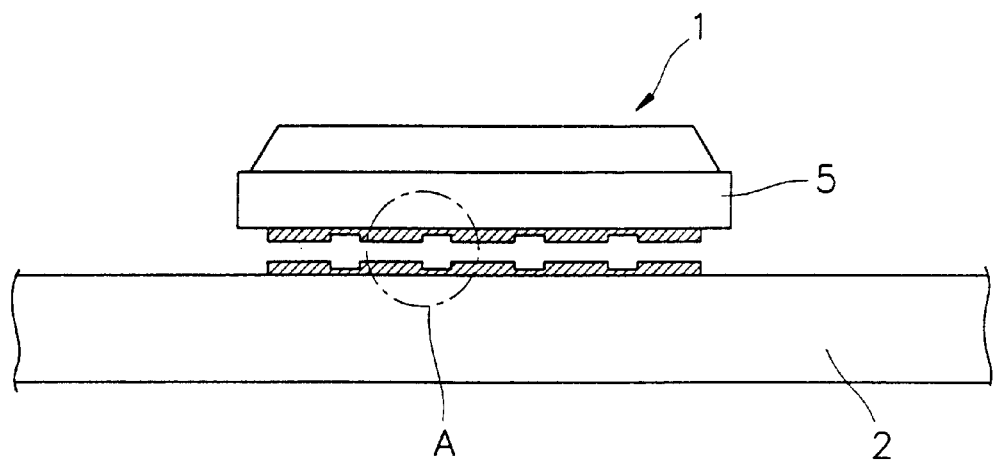
FIG. 1 is a schematic diagram for illustrating a printed circuit board mounted with a semiconductor package according to the prior art.
Figure 2:
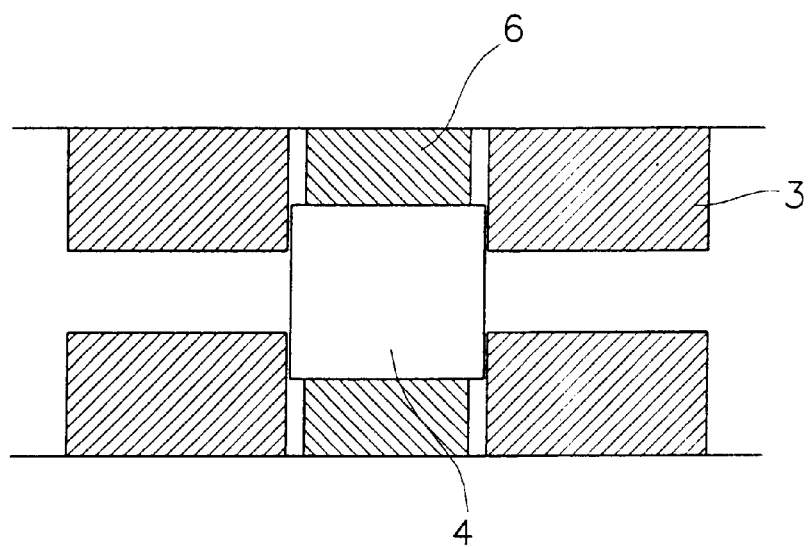
FIG. 2 is an enlarged view of A part in FIG. 1.
Figure 3:
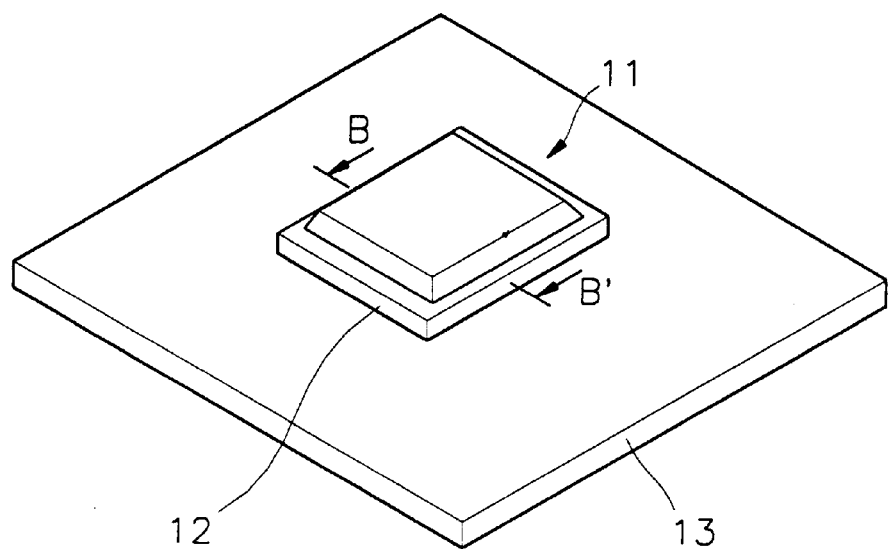
FIG. 3 is a perspective view for illustrating a printed circuit board mounted with a semiconductor package according to the present invention.
Figure 4:
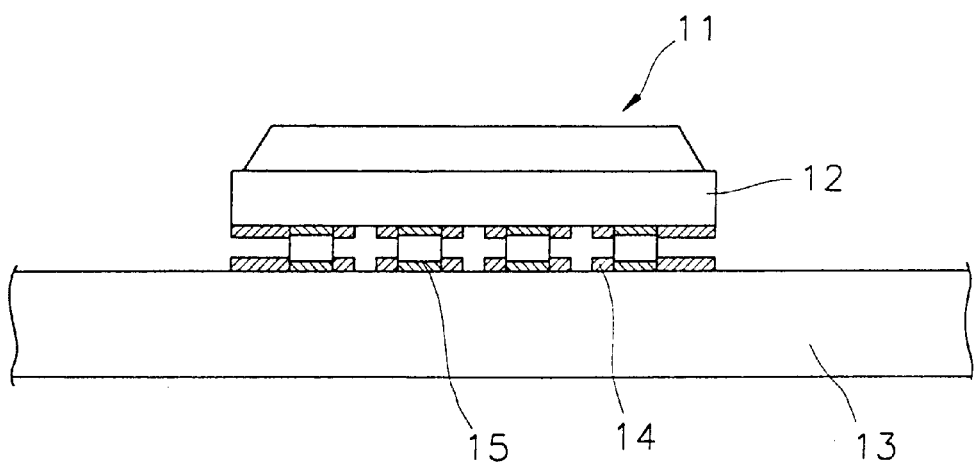
FIG. 4 is a sectional view taken along line B—B' in FIG. 3.
Figure 5:
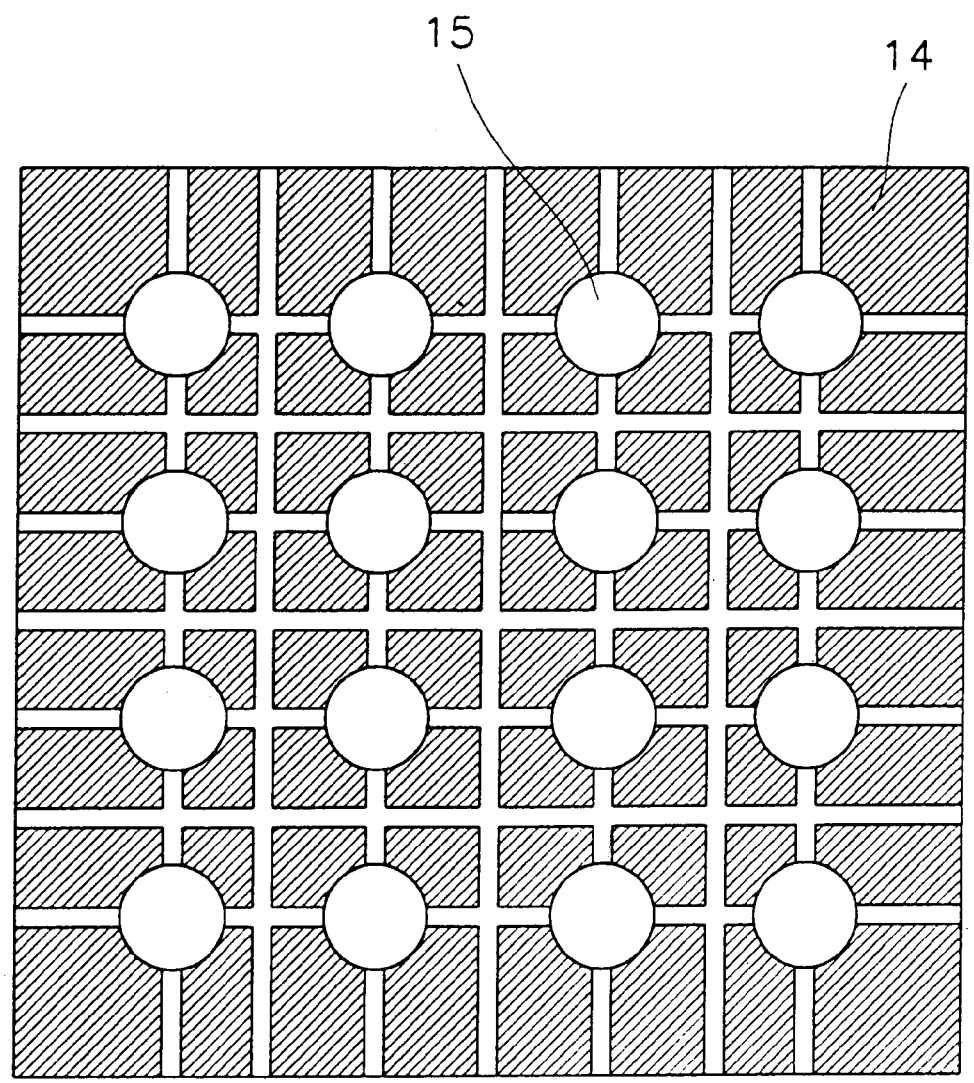
FIG. 5 is a schematic diagram for illustrating a solder resist according to the present invention.

As illustrated in FIGS. 3, 4 and 5, a Land Grid Array (LGA) type of Chip Size Package (CSP) 11 is mounted onto the printed circuit board (PCB) 13 in a state of being loaded to a substrate 12, where solder resists are formed between a bottom surface of the substrate 12 loaded with the CSP 11 and an upper surface of the PCB 13.

The solder resist 14 serves to prevent the cream solder from straying away from a predetermined position during reflow soldering, and more than one tunnel is formed at a copper pad 15 of the PCB 13 mounted with the CSP 11 and the substrate 12 arranged with the CSP 11 that connect to the outside.

Now, operational effect of the mounted structure of PCB in the semiconductor package will be described in detail.

A cream solder or a solder paste adapted to be used for mounting a PCB to a semiconductor package contains approximately 10% of flux out of total weight ratio. The flux mixes well with fine particles of solder powders having 30 $\mu$m–70 $\mu$m diameters and serves to remove an oxidation film formed around a soldering area during reflow soldering to thereby facilitate a good soldering.

However, it should be noted that flux gas evaporating from solvent contained in the flux must be smoothly extracted outside. If the flux gas is not properly extracted and stays in the soldering area, a small void is formed in the soldering area.

Generation of the void thus described can be detected by an X-ray test, and when the void is generated at the soldering area, the reliability of electronic product is much deteriorated. In other words, if the solder resist is thicker than the copper pad, the flux gas is easily confined between a solder resist of PCB and that of CSP, generating a large quantity of void during reflow soldering.

According to the present invention, a solder resist 14 is formed at a position where the substrate 12 mounted with the LGA type of CSP 11 and the PCB 13 mounted with the CSP 11 meet, thereby allowing more than one tunnel to be formed through which the flux gas can be discharged to prevent the void from being generated.

At this time, the solder resist is formed in the following manner. First, the substrate 12 mounted with the CSP 11 and the PCB 13 are coated by photosensitive resin (PSR), and a patterned film is covered thereon and is exposed to light. Then exposed portions of PSR are hardened whereby the un-hardened portions of PSR are washed away to obtain the solder resist.

The solder resist 14 is disposed such that more than one tunnel is formed to connect each pad 15 of the PSB 13 and the substrate 12 to the outside and the PSB 13 is printed with cream solder.

Successively, the substrate 12 disposed with the package 11 is positioned on the PCB 13 printed with the cream solder and reflow-soldered. The package 11 is then mounted to the PSB 13.

As apparent from the foregoing, there is an advantage in the mounted structure of printed circuit board in semiconductor package according to the present invention in that the solder resist is improved in construction thereof to allow the flux gas to be easily extracted for prevention of generation of void.

What is claimed is:

1. A mounted structure of printed circuit board in a semiconductor package, the structure comprising:

a substrate mounted with the semiconductor package;

a printed circuit board mounted with the substrate;

respective pads formed on each side of the substrate and the printed circuit board; and solder resists formed on each side of the substrate and printed circuit board, the solder resists being so arranged on the substrate and the printed circuit boards as to allow at least more than one tunnel to be formed between the resists and the pads, so that the tunnel communicates with outsides thereof.

2. The mounted structure as defined in claim 1, wherein the solder resists and pads are arranged on the substrate and the printed circuit board to allow the tunnel to be formed therebetween, thereby causing flux gas to be easily extracted for prevention of generation of void during reflow soldering.

3. The mounted structure as defined in claim 1, wherein the solder resists are formed so as to prevent a cream solder from straying away from a predetermined position during reflow soldering.

* * * * *